(12) United States Patent
Koma

(10) Patent No.: US 7,034,785 B2
(45) Date of Patent: *Apr. 25, 2006

(54) COLOR LIQUID CRYSTAL DISPLAY

(75) Inventor: Norio Koma, Gifu (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,013

(22) Filed: Nov. 19, 1998

(65) Prior Publication Data

US 2002/0070911 A1    Jun. 13, 2002

(30) Foreign Application Priority Data

Nov. 20, 1997   (JP)   ................... 9-320190

(51) Int. Cl.
G09G 3/36    (2006.01)

(52) U.S. Cl. ................... 345/88; 345/94; 345/98; 345/204; 349/33; 349/47; 349/143

(58) Field of Classification Search ........... 345/87–89, 345/98–100, 94, 204; 349/33, 34, 47, 113, 349/129, 143, 42, 5–8; 348/648; 357/59, 357/347, 578; 257/347
See application file for complete search history.

(56) References Cited

U.S. PATENT DOCUMENTS

| | | | |
|---|---|---|---|
| 3,776,615 A | 12/1973 | Tsukamoto et al. ........... 345/87 |
| 4,942,458 A * | 7/1990 | Miyajima et al. ........... 348/791 |
| 4,989,954 A * | 2/1991 | Yokoyama et al. ........... 349/72 |
| 5,153,702 A * | 10/1992 | Aoyama et al. ............ 357/59 |
| 5,157,529 A | 10/1992 | Koopman et al. .......... 349/117 |
| 5,196,924 A * | 3/1993 | Lumelsky et al. .......... 348/674 |
| 5,309,264 A | 5/1994 | Lien et al. .................. 349/143 |
| 5,408,246 A | 4/1995 | Inaba et al. .................. 345/89 |
| 5,452,019 A | 9/1995 | Fukuda et al. |
| 5,495,287 A | 2/1996 | Kasai et al. ................. 345/89 |
| 5,528,257 A * | 6/1996 | Okumura et al. ............ 345/99 |
| 5,621,479 A * | 4/1997 | Akiyama .................... 348/648 |
| 5,640,259 A * | 6/1997 | Sawayama et al. ........... 349/33 |
| 5,646,643 A * | 7/1997 | Hirai et al. ................. 345/100 |
| 5,666,179 A | 9/1997 | Koma ........................ 349/143 |
| 5,691,791 A * | 11/1997 | Nakamura et al. .......... 349/113 |

(Continued)

FOREIGN PATENT DOCUMENTS

JP    62-194227    8/1987

(Continued)

Primary Examiner—Henry N. Tran
(74) Attorney, Agent, or Firm—Hogan & Hartson, L.L.P.

(57) ABSTRACT

In an ECB LCD, in which a liquid crystal layer enclosed between a pair of substrates is driven based on R, G, B signals so that transmittance of R, G, B light components at the liquid crystal layer is controlled for color display, the voltage levels of the liquid crystal driving signals for R, G, B light are set such that the optimum transmittance, i.e., the maximum transmittance, can be achieved with respect to the R, G, B light components. With this arrangement, wavelength dependency, if any, of the liquid crystal with respect to the light coming into the light crystal layer can be modified so that color display is achieved with superior color reproducibility.

32 Claims, 8 Drawing Sheets

U.S. PATENT DOCUMENTS

| | | | |
|---|---|---|---|
| 6,014,194 A * | 1/2000 | Kuo et al. | 349/88 |
| 6,037,922 A * | 3/2000 | Yagyu | 345/89 |
| 6,078,317 A * | 6/2000 | Sawada | 345/204 |
| 6,144,353 A * | 11/2000 | McKnight | 345/94 |
| 6,181,368 B1 * | 1/2001 | Takahashi et al. | 348/65 |
| 6,304,304 B1 * | 10/2001 | Koma | 349/33 |
| 5,790,240 A * | 8/1998 | Ishikawa et al. | 355/68 |
| 5,818,558 A | 10/1998 | Ogishima | 349/110 |
| 5,834,827 A * | 11/1998 | Miyasaka et al. | 257/578 |
| 5,920,301 A * | 7/1999 | Sakamoto et al. | 345/96 |

FOREIGN PATENT DOCUMENTS

| | | |
|---|---|---|
| JP | 1-277219 | 11/1989 |
| JP | 6-089083 | 3/1994 |
| JP | 6095104 | 4/1994 |
| JP | 6-138849 | 5/1994 |
| JP | 6-273772 | 9/1994 |
| JP | 7-175034 | 7/1995 |
| JP | 7-294889 | 11/1995 |
| JP | 8-016134 | 1/1996 |
| JP | 9-090909 | 4/1997 |

* cited by examiner

COLOR LIQUID CRYSTAL DISPLAY

BACKGROUND OF THE INVENTION

1. Field of the Invention

The present invention relates to a color liquid crystal display (LCD) which employs a voltage control birefringence method for controlling the tilt direction of, for example, vertically-alignment liquid crystal by using an electric field.

2. Description of the Prior Art

LCDs, in which liquid crystal is enclosed between a pair of substrates and a voltage is applied to the enclosed liquid crystal for desired display are advantageously small and thin, and the power consumption thereof can be easily reduced. Due to these advantages, LCDs are widely used as displays in various office automation equipment, such as personal computers, and audio visual equipment, such as a projector, and portable or on-board devices.

In particular, a DAP (deformation of vertically aligned phase) LCD is proposed, which includes liquid crystal with negative dielectric constant anisotropy, and controls initial alignment of the liquid crystal molecules so as to be vertically-aligned by using a vertical alignment layer. Specifically, a DAP LCD employs one type of electrically controlled birefringence (ECB) methods, and controls transmittance and displayed colors of the light coming into the liquid crystal layer by utilizing a difference in a reflective index between the longer and shorter axes of a liquid crystal molecules, i.e., a birefringence phenomenon. A pair of substrates are provided each with a polarization film attached on the outer surface thereof, such that their polarization directions are orthogonal to each other. When voltage is applied to the liquid crystal layer, linearly polarized light which has been introduced into the liquid crystal layer via the polarization film on one side of the substrate is converted into elliptically or circularly polarized light due to birefringence thereof of the liquid crystal layer, and is partly ejected from the polarization film on the other side. Since the extent of birefringence of the liquid crystal layer, i.e., a phase difference (a retardation amount) between ordinary and extraordinary ray components of the incoming linearly polarized light, is determined according to the voltage applied to the liquid crystal layer, i.e., the intensity of an electric field generated in the liquid crystal, the amount of light ejected from the second polarization film can be controlled for every pixel by controlling for every pixel the voltage applied to the liquid crystal layer. This eventually makes it possible to display a desired color image when RGB color filters and RGB light sources are used.

DESCRIPTION OF THE RELATED ART

A DAP LCD can be fabricated without a rubbing step for giving the liquid crystal vertical alignment in a manufacturing process as a result of improvement of a panel structure. The DAP method can therefore be employed in an LCD which includes a thin film transistor (TFT) as a switching element for driving each liquid crystal element and as a driver for driving the switch element.

However, an LCD having a structure which can make optimum use of or even improve the characteristics of a low temperature poly silicon (p-Si) TFT and those of the DAP method is yet to be developed for optimization.

For example, while being superior in having a wider viewing angle and originally-high transmittance of incoming light, the DAP method has unfortunately dependency on the wavelength of incoming light since the amount of permeated light transmittance is determined depending on the birefringence extent of the liquid crystal layer, such as $\Delta n \cdot d/\lambda$ ($\Delta n$: variation of refractive index of liquid crystal layer, d: thickness of liquid crystal layer; $\lambda$ wavelength of incoming light). It is possible to reduce the wavelength dependency through, for example, adjustment of the thickness d of the liquid crystal layer as the wavelength dependency is weaker for a larger $\Delta n \cdot d$. However, since such adjustment may cause unfavorable effects in view of parallax, control of the wavelength dependency through adjustment of the thickness d of the liquid crystal layer is subject to limitation. On the other hand, in view of a lower power consumption, a study is being made to develop a material which is superior in response characteristics respect with a low voltage. Also, a material which has a smaller $\Delta n$ than conventional liquid crystal material may be used. In the case of a reflection LCD, the value $\Delta n \cdot d$ may necessarily be small due to the characteristics of the device. Therefore, wavelength dependency of an LCD with respect to incoming light cannot be considered negligible as it may adversely affect the quality of color display, particularly, in view of color reproducibility.

SUMMARY OF THE INVENTION

The present invention has been conceived to overcome the above problems and aims to provide a device which enables displaying, in particularly, color-displaying with high quality through modification of wavelength dependency of an LCD with respect to incoming light.

According to a first aspect of the present invention, there is provided a liquid crystal display having liquid crystal sandwiched by a pair of substrates having electrodes for driving the liquid crystal based on a liquid crystal control driving signal for R light, a liquid crystal control driving signal for G light, and a liquid crystal control driving signal for B light to control transmittance of R light components, G light components, and B light components for color display, wherein a driving voltage for application to the liquid crystal is set independently for R display, G display, and B display.

According to a second aspect of the present invention, there is provided an ECB liquid crystal display having liquid crystal sandwiched by a pair of substrates having electrodes for driving the liquid crystal based on a liquid crystal control driving signal for R light, a liquid crystal control driving signal for G light, and a liquid crystal control driving signal for B light to control transmittance of R light components, G light components, and B light components for color display, wherein a driving voltage for application to the liquid crystal is set independently for R display, G display, and B display.

Further, in the above liquid crystal display, an upper limit value of a range for the driving voltage is set independently for R light, G light, and B light.

When a driving voltage is independently controlled for R, G, B light, wavelength dependency with respect to incoming light can be modified in color display in which the white color is displayed through composition of R, G, B light, so that adequate color reproducibility can be easily realized regardless the difference of the liquid crystal material in use or the thickness of the liquid crystal layer.

Further, in the above liquid crystal display, the liquid crystal control driving signal for R light, the liquid crystal control driving signal for G light, and the liquid crystal control driving signal for B light are separately subjected gamma correction based on transmittance characteristics of the R light components, the G light components, and the b light components.

When gamma correction is carried out for the liquid crystal control driving signals for R, G, B light according to the respective characteristics of the R, G, B light, color reproducibility can be enhanced even with respect to intermediate graduation. This enables liquid crystal color display with higher quality.

Still further, in the above liquid crystal display the pair of substrates includes a first substrate, electrodes for driving the liquid crystal formed on the first substrate include a plurality of pixel electrodes arranged in a matrix thereon; and the plurality of pixel electrodes are connected to corresponding p-Si thin film transistors each using a p-Si layer formed at a low temperature for an active layer.

When a p-Si thin film transistor is used as a switching element for each liquid crystal pixel, it is possible to drive each pixel of the LCD by a low voltage to display a very fine image.

As described above, according to the present invention, liquid crystal driving signals for R, G, B are adjusted according to the respective transmittance characteristics, so that respective colors can be favorably reproduced for display even by an LCD with high wavelength dependency.

BRIEF DESCRIPTION OF THE DRAWINGS

The above and the other objects, features, and advantages of the present invention, will become further apparent from the following description of the preferred embodiment taken in conjunction with the accompanying drawings wherein.

DESCRIPTION OF THE PREFERRED EMBODIMENTS

In the following, a preferred embodiment of the present invention (hereinafter referred to as a preferred embodiment) will be described with reference to the accompanying drawings. In this embodiment, an ECB LCD or a DAP LCD is used, in which an ECB LCD controls alignment of liquid crystal by using a electric field so that a transmittance amount is controlled by utilizing a birefringence phenomenon, and the DAP LCD is one type of the ECB LCDs. Specifically, when using a DAP LCD, R, G, B liquid crystal driving signals are controlled based on the transmittance characteristics of corresponding R, G, B light components whereby R, G, B liquid crystal voltage levels (an ON display level) are controlled.

[LCD Panel Structure]

Figure 1:
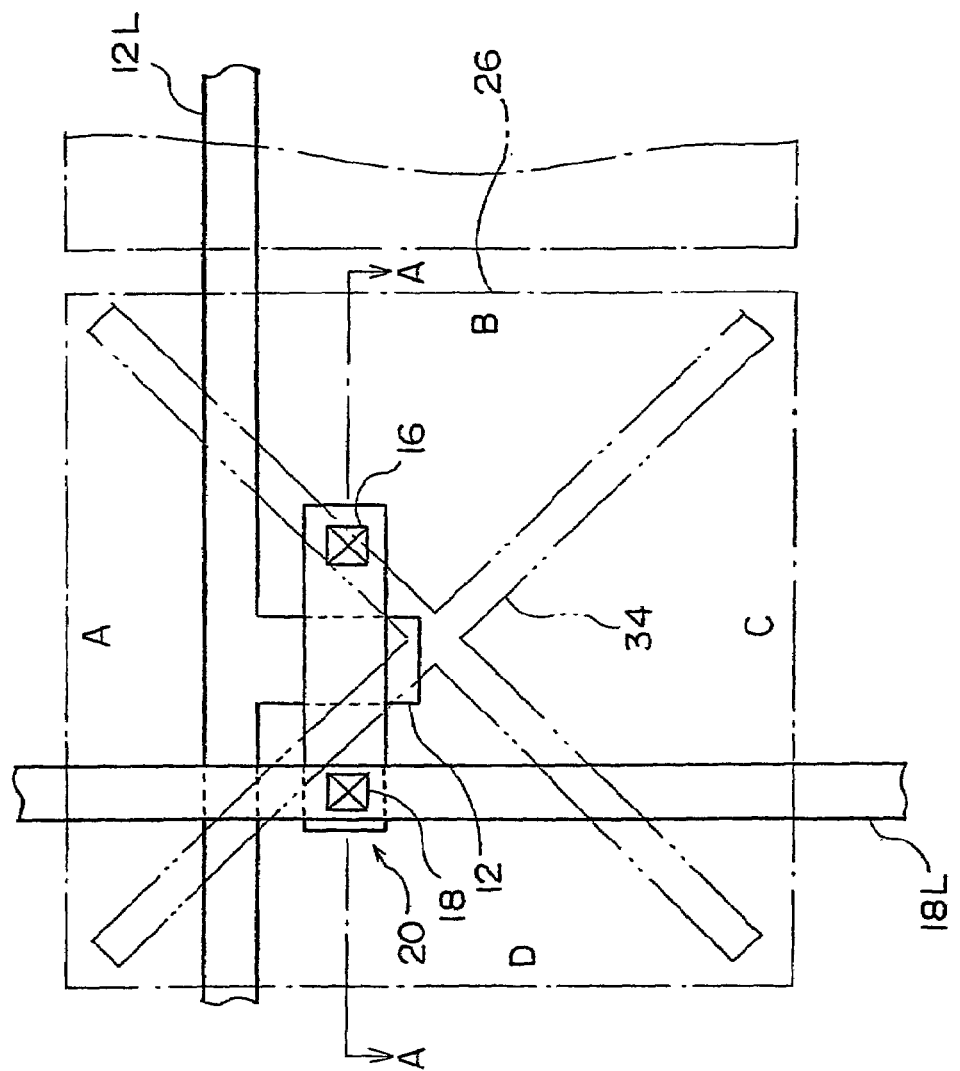
FIG. 1 is a conceptual plan view showing an example of a structure of an LCD panel according to a preferred embodiment.
Figure 2:
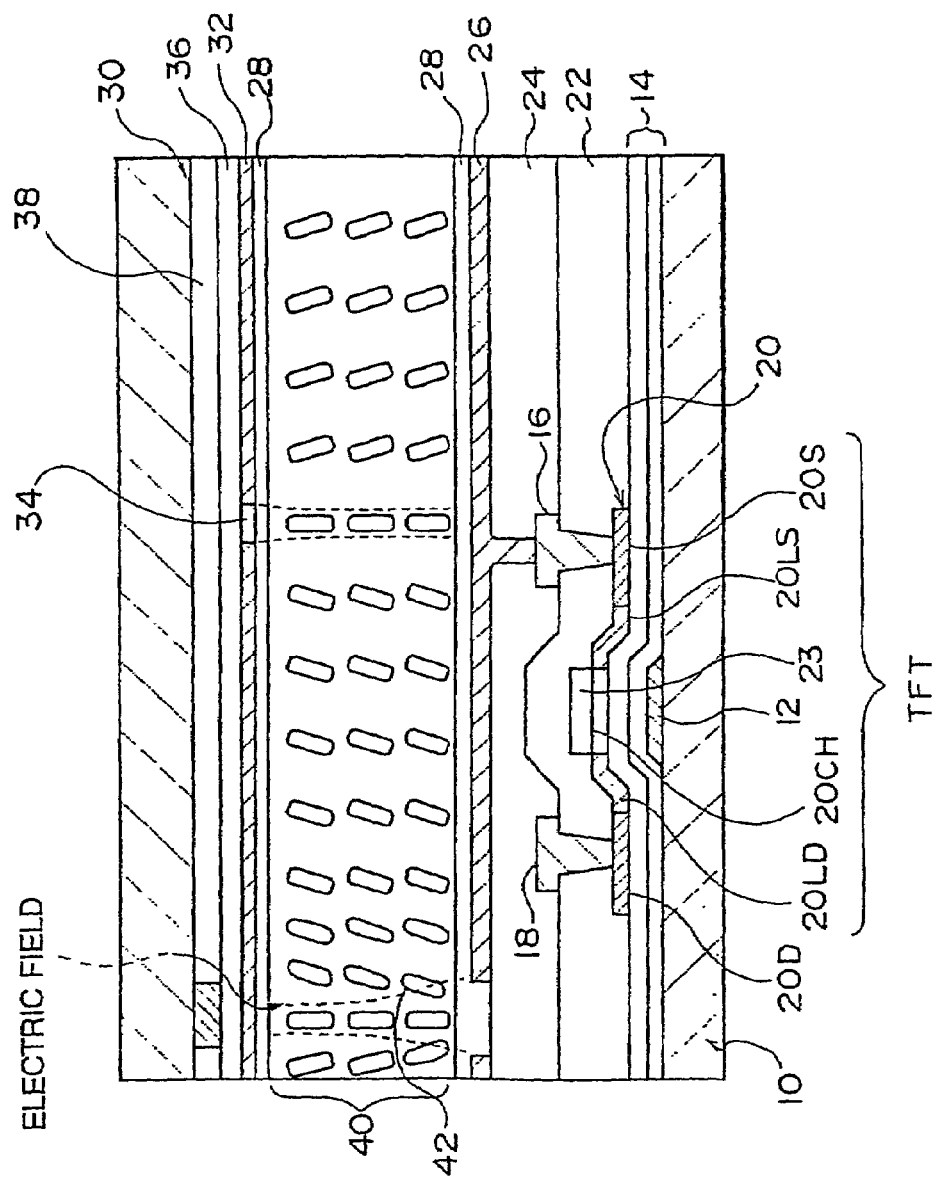
FIG. 2 is a schematic cross sectional view of the LCD panel along the A—A line in FIG. 1.

Referring to FIGS. 1 and 2, a structure of a DAP LCD panel to be driven will be described. FIG. 1 shows one example of a plan structure of an LCD panel; FIG. 2 shows one example of a schematic cross sectional structure of the LCD panel along the line A—A shown in FIG. 1. An LCD according to the preferred embodiment comprises a TFT substrate (a first substrate) 10 and an opposing substrate (a second substrate) 30. On the first substrate 10, a lower temperature poly silicon (p-Si) TFT is formed, above which a pixel electrode 26 is further formed. On the second substrate 30, which is provided opposing the first substrate 10 having a liquid crystal layer 40 in-between, a common electrode 32 is formed which has an direction control window 34 thereon. Further, polarization films 44, 46 are attached to the outer sides of the respective substrates 10, 30 such that respective transmittance polarized light directions are orthogonal to each other.

More specifically, on the TFT substrate 10 which is made of glass or other material, there are formed a gate electrode 12 and a gate electrode line 12L which is integral to the gate electrode 12 in this embodiment. The gate electrode 12 and the line 12L are formed by patterning metal such as Cr, Ta, Mo, and so on. Further, covering the gate electrode 12 and the line 12L, a gate insulating film 14 is formed which is made of either one of SiNx and $SiO_2$ or layers of these materials stuck on top of each other. On the gate insulating film 14, a p-Si thin film 20 is formed to serve as an active layer of the TFT. The p-Si thin film 20 is formed by annealing, at a low temperature, an amorphous silicon (a-Si) thin film through both or either laser and/or lamp annealing for poly-crystallization and patterning into an island shape after the annealing.

On the p-Si thin film 20, an implantation stopper (doping stopper) 23 is formed which is made of $SiO_2$ or other material. The doping stopper 23 is formed through self-alignment so as to a shape substantially identical to the gate electrode 12 when the TFT substrate 10 is exposed to light from its rear side (the bottom side in FIG. 2) while using the gate electrode 12 as a mask. Further, when impurities, such as, phosphorous or arsenic, are doped into the p-Si thin film 20 to be at a low concentration by using the injection stopper 23 as a mask, a low concentration source region 20LS and a low concentration drain region 20LD are formed through self-alignment on the respective sides of the region directly below the doping stopper 23, of the p-Si thin film 20. The low concentration source region 20LS and the low concentration drain region 20LD contain the doped impurities at a low concentration. The region directly below the doping stopper 23 of the p-Si thin film 20 contains no impurities because the doping stopper 23 served as a mask at the time of ion doping, so that the region constitutes an intrinsic region serving as a channel region 20CH of the TFT. Further, a source region 20S and a drain region 20D are formed on the outer sides of the low concentration source region 20LS and the low concentration drain region 20LD, respectively, from the doping stopper 23 when the identical impurities are further doped therein to be at a higher concentration.

On the doping stopper 23 and the p-Si thin film 20 where the respective regions (20CH, 20LS, 20LD, 20S, 20D) have been formed in the above processes, an inter-layer insulating layer 22 made of SiNx or other material is formed covering these regions. Further, on the inter-layer insulating film 22, a source electrode 16, a drain electrode 18, and a drain electrode 18L which is integral to the drain electrode 18 are formed, made of Al, Mo, or other material. The source electrode 16 and the drain electrode 18 are connected via contact holes opened throughout the inter-layer insulating film 22 to the low concentration source region 20S and the low concentration drain region 20D, respectively.

A low temperature p-Si TFT of this embodiment comprises the aforementioned gate electrode 12, the gate insulating film 14, the p-Si thin film 20 (20CD, 20LS, 20LD, 20S, 20D), the source electrode 16, and the drain electrode 18. The TFT further comprises an active layer made of a p-Si thin film 20 having been formed in low temperature processing. Although the above TFT is of a bottom-gate type in which a gate electrode 12 is positioned on the lower side of the elements, a TFT is not limited thereto and may be of a top-gate type in which a gate electrode is formed in a layer above the p-Si thin film.

On substantially the entire part of the TFT substrate 10, a flattening inter-layer insulating film 24 of 1 µm or more thick is formed covering the above-structured TFT and inter-layer insulating film 22 for planarization of the top surface. A flattening inter-layer insulating film 24 is made of SOG (Spin on Glass), BPSG (Boro-phospho-Silicate Glass), acrylic resin, or other material. On the flattening inter-layer insulating film 24, a pixel electrode 26 is formed covering the TFT region, for driving the liquid crystal. A pixel electrode 26 is made of, in the case of a transmission display, a transparent conductive film, such as ITO (indium Tin Oxide), and connected via the contact hole formed throughout the flattening inter-layer insulating film 24 to the source electrode 16. For a reflection display, conductive reflective material, such as Al, may be used for a pixel electrode 26.

Also, on substantially the entire part of the TFT substrate 10, a vertically-alignment film 28 is formed covering the pixel electrode 26. The vertically-alignment film 28, which is made of a material, such as polyimide, serves as an alignment film for setting the liquid crystal molecules to have vertical alignment without a rubbing step.

The opposing substrate (the second substrate) 30, which is situated opposite to the above TFT substrate 10 having the liquid crystal layer 40 in-between, is made of glass or other material, similar to the TFT substrate 10. On the surface of the opposing substrate 30 facing the TFT substrate 10, RGB color filters 38 are formed in a predetermined alignment so as to correspond to the pixel electrodes 26. On the RGB color filter 38, which is covered by a protection film 36, such as acrylic resin, there is formed a common electrode 32, which is made of a material such as ITO, for driving the liquid crystal in corporation with the opposing pixel electrode 26. Note that, when an LCD panel is used as a light valve of a projector, in a system in which three panels are used respectively for R, G, B, a color filter 38 is unnecessary because incoming light has already been separated into R, G, B.

Also, the common electrode 32 has an electrode-free area formed as an direction control window 34 on a part thereof corresponding to the pixel electrode 26 (described later). An direction control window 34 may have an X shape. Covering the common electrode 32 and the direction control window 34, a vertically-alignment film 28 is formed, similar to the TFT substrate 10.

The liquid crystal layer 40 is a crystal liquid layer enclosed in a space, for example, of 3–5 µm thick between the substrates 10, 30. The liquid crystal layer 40 is made of liquid crystal material having negative dielectric constant anisotropy, which has a larger dielectric constant in a shorter axial direction than in a longer axial direction of a liquid crystal molecule 42. Liquid crystal material for use in the liquid crystal layer 40 in this embodiment is a mixture of the liquid crystal molecules having fluorine for a side chain, expressed by the following chemical formulas (1) to (6), at a desired ratio so as to contain at least one type of these liquid crystal molecules.

[Chemical formula 1]

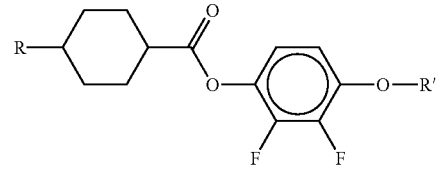

(1)

[Chemical formula 2]

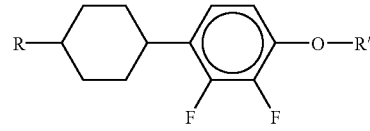

(2)

[Chemical formula 3]

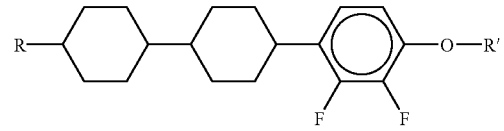

(3)

[Chemical formula 4]

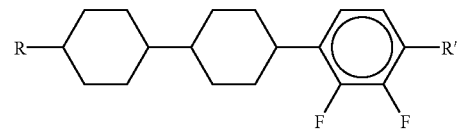

(4)

[Chemical formula 5]

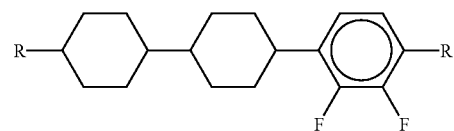

(5)

[Chemical formula 6]

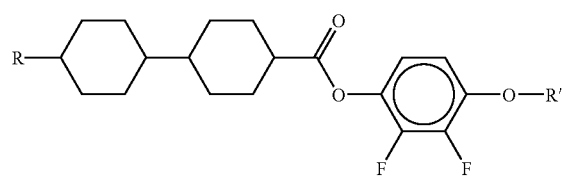

(6)

Presently, liquid crystal molecules having cyano(CN—) for a side chain are mainly used as liquid crystal material with negative dielectric constant anisotropy for use in a TFT LCD including an a-Si active layer with low mobility. However, liquid crystal molecules with a cyano side chain must be driven by a sufficiently high voltage as they would otherwise be largely affected by a residual DC voltage. Moreover, those LC molecules have a poor voltage holding ratio, and may possibly cause image persistence. On the other hand, this embodiment uses a p-Si TFT which was made using low-temperature processing and is adapted to be driven by a low driving voltage. If the presently used liquid crystal material having a cyano side chain (which must be driven by a high voltage), is used in this embodiment, the characteristics of the p-Si TFT, i.e., being adapted to be driven by a low driving voltage, cannot be utilized effectively. Therefore, the above mentioned liquid crystal molecules having fluorine for a side change are adequately mixed for use in this embodiment. The resultant liquid crystal layer 40 is adapted to be driven by a low voltage, and can maintain a sufficiently high holding rate when driven by a low driving voltage through the p-Si TFT, and even prevent image persistence. Also, the resultant LCD has lower power consumption than an LCD which employs an a-Si TFT, because it can be driven by a lower voltage.

Further, since an direction control window 34, which is an electrode-free region in the common electrode 32, is formed, as shown in FIGS. 1 and 2, liquid crystal molecules are caused to tilt in a predetermined direction, using the direction control window 34 as a reference so that response of the molecules is improved. Moreover, since the alignment direction is resultantly diverged within a single pixel due to the window 34, viewing angle dependency of the liquid crystal display is modified, which makes it possible to achieve a display with a wider viewing angle.

Specifically, when a voltage is applied to the liquid crystal layer 40 (a white display, i.e., in a liquid crystal ON state), diagonal electric fields are generated between the edges of the pixel electrodes 26 and the common electrodes 32. The diagonal fields are actually diagonal in different directions in respective portions, as indicated by the broken line in FIG. 2. This causes the vertically-aligned liquid crystal molecules at the edges of the pixel electrodes 26 to tilt in a direction opposite to the diagonal direction of the electric field. Since liquid crystal molecules 42 have continuity, once the tilt direction of the liquid crystal molecules at the edge of the pixel electrode 26 is determined due to the diagonal electric field (the tilt angle is determined according to the electric field intensity), the liquid crystal molecules around the center of the pixel electrode 26 are accordingly caused to tilt in the similar direction. That is, when a pixel is driven, a plurality of regions are caused in a single pixel region, where liquid crystal molecules tilt in different directions.

On the other hand, liquid crystal molecules in an area corresponding to the direction control window 34 remain vertically-aligned, as shown in FIG. 2, since the direction control window 34 always receives a voltage less than a liquid crystal driving threshold value. As a result, the direction control window 34 always makes a boundary between the regions with liquid crystal molecules tilting in different regions. For example, with an X-shaped direction control window 34, as shown in FIG. 1, the boundaries for separating the regions A, B, C, D where liquid crystal molecules tilt in different directions are fixed on the X-shaped direction control window 34. With this arrangement, direction separation is successfully made within a single pixel region, and the boundaries for the separation can be fixed on the direction control window 34. Moreover, a plurality of (four in this embodiment, i.e., upper, lower, right, and left) priority viewing angle directions can be ensured, so that an LCD with a wider viewing angle can be provided.

Also, the pixel electrode 26 is provided on the inter-layer insulating films 22, 24, covering the region where the TFT and electrode lines thereof (gate electrode lines, drain electrode lines), and so on, are formed. Therefore leakage of magnetic fields generated by the TFT and its electrode lines into the liquid crystal layer 40 is prevented, as are the resulting effects on the alignment of the liquid crystal molecules. Further, a flattening inter-layer insulating film 24 can improve the planarity of the surface of the pixel electrode 26, and can be prevented the disturbance to the alignment of liquid crystal molecules due to the uneven surface of the pixel electrode 26. With the above arrangement with a reduced leaking electric field from the TFT and the electrode lines and the pixel electrode 26 with a more flattened surface, a step of rubbing the vertical alignment film 28 is unnecessary as the alignment of the liquid crystal molecules is controlled by using a function of the electric fields caused at the edge portion of the pixel electrode 26 and in the direction control window 34.

Further, with the above arrangement in which the pixel electrode 26 is formed covering the TFT and respective electrode lines, an excessive alignment margin for the TFT and the lines is unnecessary. This can improve an aperture ratio.

[Driving Circuit]

Next, a driving circuit and method for improving a response time of the above-structured DAP LCD panel in a normally-black mode will be described.

Figure 3:
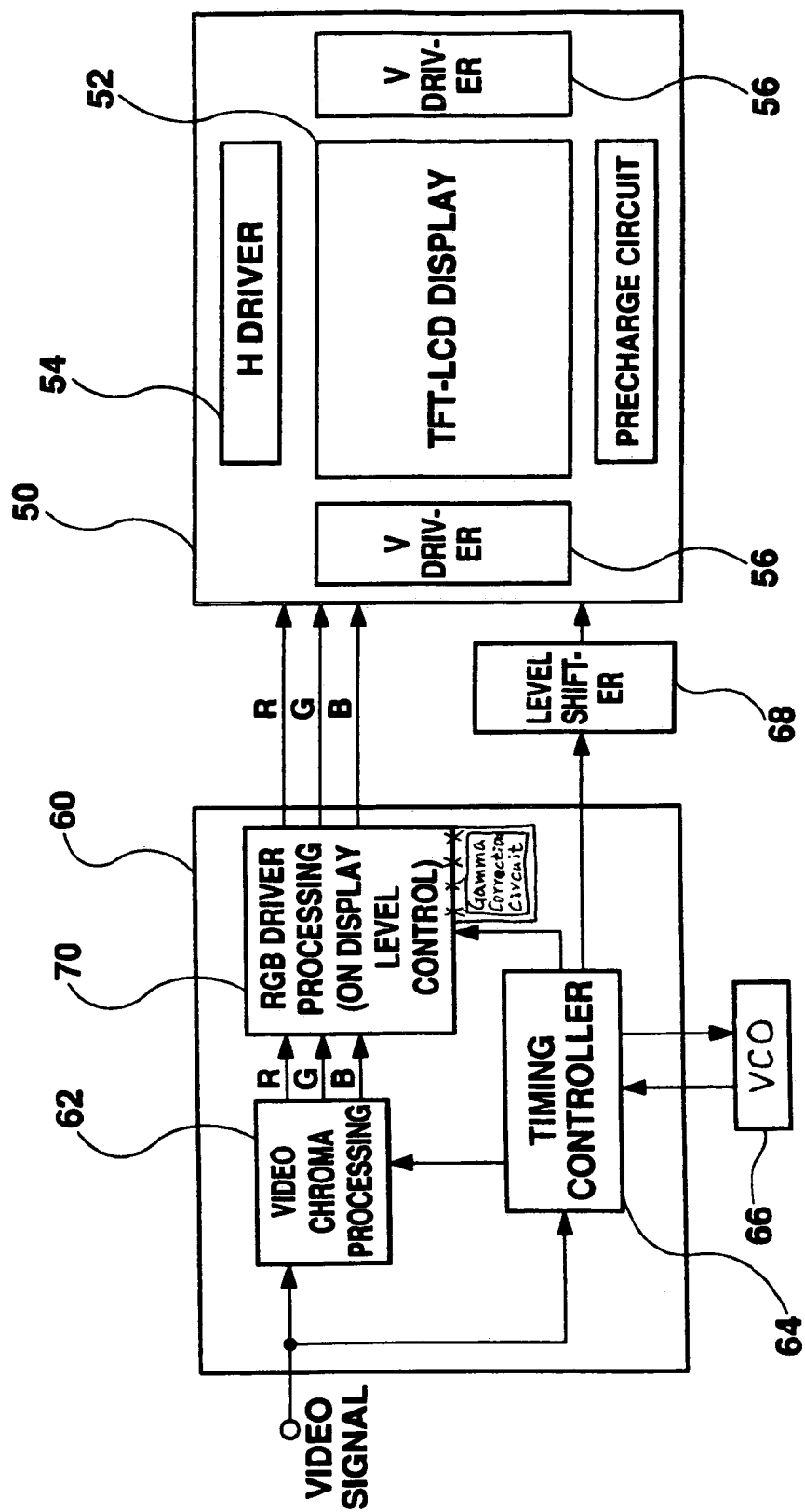
FIG. 3 is a block diagram showing a global structure of the LCD according to the preferred embodiment.

Referring to FIG. 3, which shows a global structure of an LCD of this embodiment, the LCD comprises an LCD panel 50 and a driving circuit 60 therefor.

The LCD panel 50 has a display area 52, where a TFT substrate and an opposing substrate sandwich a liquid crystal layer, as shown in FIGS. 1 and 2, and low temperature p-Si TFTs are formed as a display TFTs on the TFT substrate side. Note that the channel, source, and drain of a low temperature p-Si TFT can be formed through self-alignment. Around the display 52 on the TFT substrate, an H driver 54 and V drivers 56 are formed for horizontal and vertical selection of the display TFTS, respectively. These H and V drivers 54, 56 are formed using p-Si TFTs each having a CMOS structure. A p-Si TFT having a CMOS structure is formed in a process substantially same to the process for forming a p-Si TFT for the display area 52 whose channel, source, and drain can be formed through self-alignment. With the above panel structure, a rubbing step which may adversely affect the closely situated p-Si TFTs for the drivers 54, 56, can be omitted. This contributes to improving the yield of an LCD.

The driving circuit 60 of the liquid crystal panel 50 is constructed with integrating a video chroma processing circuit 62, a timing controller 64, and other components. The video chroma processing circuit 62 generates R, G, B video signals by using an input composite video signal. Using reference oscillation signals generated by a VCO 66, the timing controller 64 generates various timing control signals based on an inputted video signal, to supply to the video chroma processing circuit 62, an RGB driver processing circuit 70, a level shifter 68, or other circuits. Using R, G, B video signals supplied from the circuit 62, the RGB driver processing circuit 70 generates AC driving signals for R, G, B according to the characteristics of the TFT LCD, to output to the LCD panel 50.

In this invention, liquid crystal driving signals are controlled so as to achieve ON display levels set for R, G, B, respectively. The setting of ON display levels and the controlling of the levels of liquid crystal driving signals can be made by using an RGB driver processing circuit 70 having a structure described later.

Figure 4:
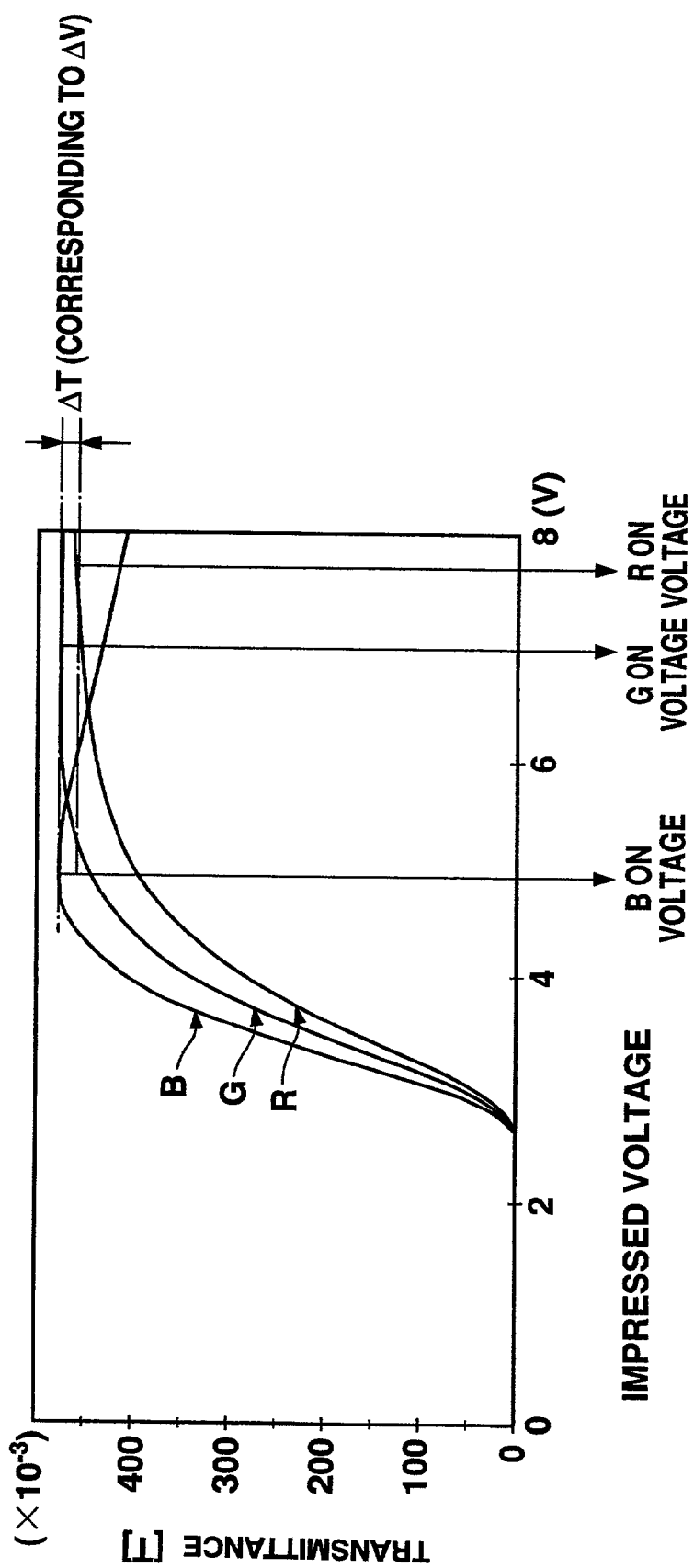
FIG. 4 is a graph showing wavelength dependency of an impressed voltage and transmittance with the LCD panel according to the preferred embodiment.

FIG. 4 shows the relationship between impressed voltages [V] and transmittance [T] for R, G, B.

As having already been described, transmittance with an ECB LCD largely depends on a birefringence extent, expressed as $\Delta n \cdot d/\lambda$, and transmittance of incoming light depends on wavelength. Also, when the liquid crystal materials expressed by the above chemical formations (1)–(6) are used to easily achieve low voltage driving by using a low temperature p-Si TFT, the $\Delta n$ value of the materials may be set at, for example, approx. 0.07. Specifically, it may be set at approx. 0.07 or less for a reflection display. Further, in the case of a reflection LCD, the $\Delta n \cdot d$ value is desired to be set at 0.3 or less in order to achieve low voltage driving. Therefore, impressed voltage-transmittance characteristics of R (R$\lambda \approx$630 nm), (G$\lambda \approx$550 nm), (B$\lambda \approx$460 nm) resultantly differ significantly from one another. Also, as shown in FIG. 4, the impressed voltage for the largest transmittance differs among R, G, B. In the example shown in FIG. 4, the largest transmittance, i.e., approx. $475 \times 10^{-3}$, can be achieved with an impressed voltage of approx. 7 V for G and approx. 5 V for B. However, it cannot be achieved for R even with an impressed voltage of approx. 8 V.

In this embodiment, in order to achieve substantially equal transmittance for R, G, B colors with an ECB having wavelength dependency, a liquid crystal driving level for the maximum transmittance, i.e., a voltage level for turning on the liquid crystal pixels, must be set, for example, at approx. 7.8 V for R, 7 V for G, and 4.9 V for B, when the respective color components have the characteristics shown in FIG. 4. With this setting, the white color can be precisely displayed for color display in which the white color is displayed through composition of R, G, B light.

Also, in adjustment of driving voltage levels, since the characteristics of an impressed voltage-transmittance relationship are different for R, G, B, gamma correction may be given to the liquid crystal driving signals for R, G, B in, for example, an RGB driving processing circuit 70 according to the respective characteristics. With this adjustment, color reproducibility can be enhanced even with respect to intermediate graduation.

Figure 5:
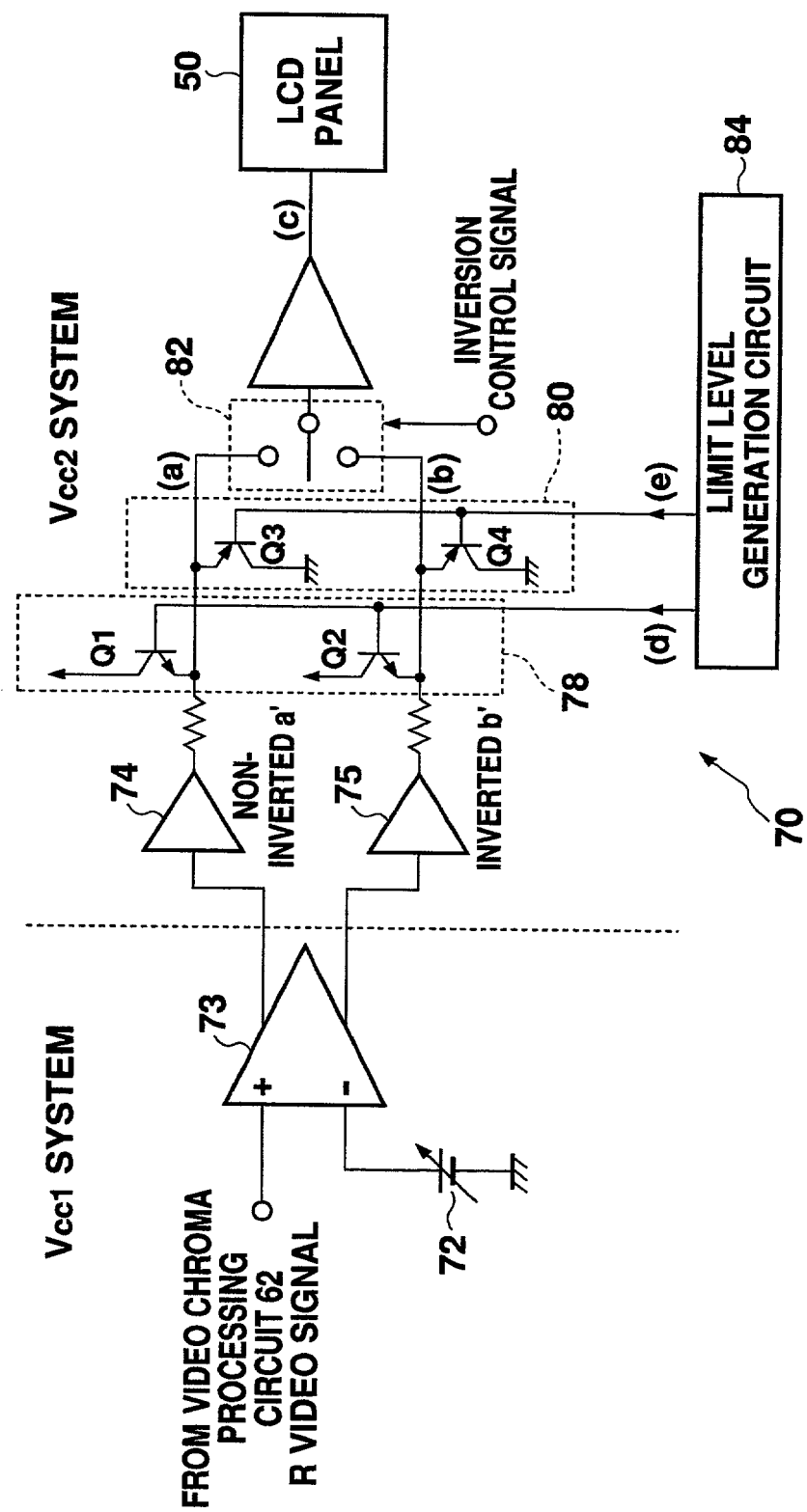
FIG. 5 is a schematic diagram showing a structure of an RGB driver processing circuit 70 shown in FIG. 3.
Figure 6:
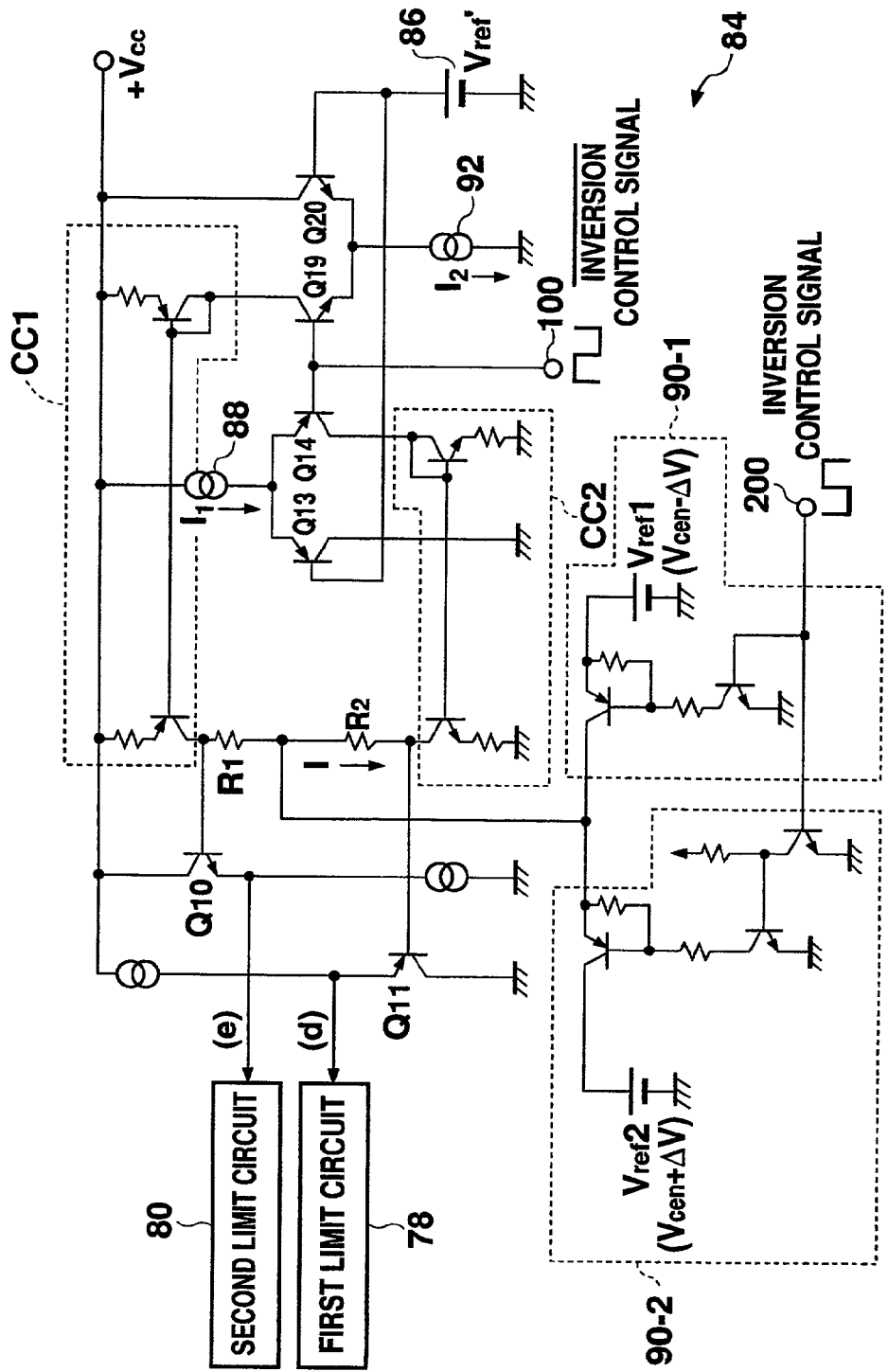
FIG. 6 is a diagram showing a structure of a limit level generation circuit 84 shown in FIG. 5.
Figure 7:
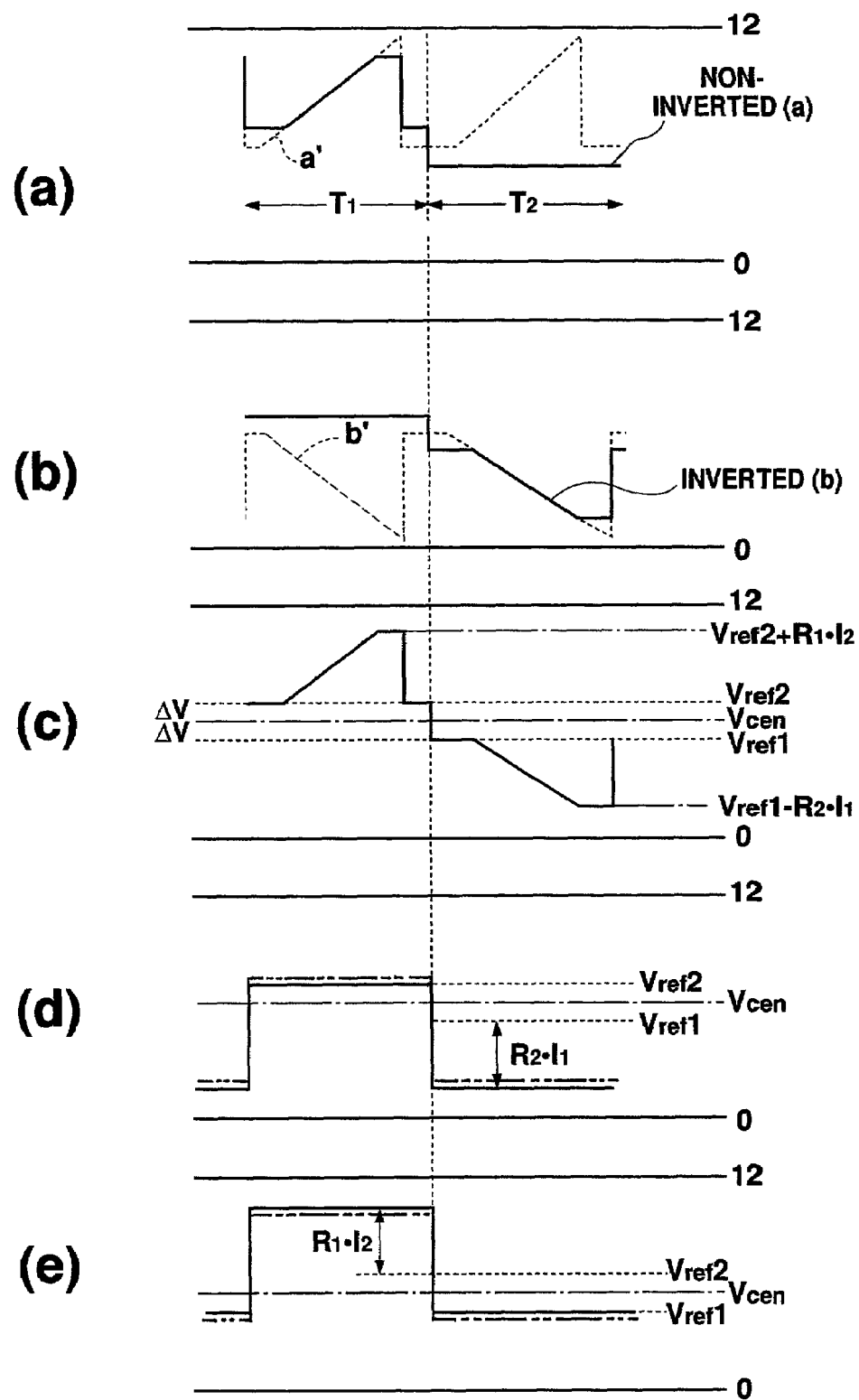
FIG. 7 is a diagram showing waveforms of signals in the circuit shown in FIG. 5.

FIG. 5 shows a partial structure of an RGB driver processing circuit 70 for adjusting an ON display voltage level for every RGB liquid crystal driving signal. Although the structure shown in the drawing particularly concerns an R liquid crystal driving signal, an identically structured circuit is provided for each of the other colors, namely G, B. FIG. 6 shows an example of a limit level generation circuit 84 shown in FIG. 5; FIG. 7 shows a waveform of a signal which is changed in the RGB driving processing circuit 70 shown in FIG. 5.

Video signals for R outputted from the video chroma processing circuit 62 are supplied to a differential output amplifier 73 shown in FIG. 5. In the differential output amplifier 73, the signals are subjected to brightness adjustment to change the signals so as to have a DC voltage which is determined based on the voltage of a bias circuit 72. The differential output amplifier 73 outputs a non-inverted signal and an inverted signal to a first buffer 74 and a second buffer 75, respectively. The first buffer 74 outputs a non-inverted output signal a' having a waveform indicated by the broken line in FIG. 7(a); the second buffer 75 outputs an inverted output signal b' indicated by the broken line in FIG. 7(b). These signals a' and b' are then supplied to a first limit circuit 78 and subsequently to a second limit circuit 80 before being outputted to a multiplexer 82. The first and second limit circuits 78, 80 defines the lower and upper limit level of the signals a' and b' for every one cycle (see the waveforms indicated by the solid lines in FIGS. 7(a) and (b)).

The multiplexer 82 alternately selects a non-inverted and an inverted output signal (a), (b) of which levels are controlled with a first and a second limit circuits, for every predetermined cycle T (e.g., one frame period, one line period, and so on) based on an inversion control signal, to output via a buffer to the LCD panel 50 as an AC driving signal (c) for driving the liquid crystal for R display.

The first limit circuit 78 comprises a transistor Q1 and a transistor Q2. The transistor Q1 is connected in a signal path between the first buffer 74 and the multiplexer 82; and the transistor Q2 is connected in a signal path between the second buffer 75 and the multiplexer 82. Transistors Q1 and Q2 receive, at their bases, a first level control signal (d) having a waveform shown in FIG. 7(d) from a limit level generation circuit 84.

The second limit circuit 80 comprises a transistor Q3 and a transistor Q4. The transistor Q3 is connected in a signal path between the first buffer 74 and the multiplexer 82; and the transistor Q4 is connected in a signal path between the second buffer 75 and the multiplexer 82. The transistors Q3 and Q4 receive, at their bases, a second level control signal (e) having a waveform shown in FIG. 7(e) from a limit level generation circuit 84, and operate in response to the received second level control signal (e). When the impressed voltage-transmittance relationship has the characteristics shown in FIG. 4, levels of a non-inverted output signal (a) and an inverted output signal (b) are controlled in response to the limit levels of the transistor Q2 of the first limit circuit 78 and the transistor Q3 of the second limit circuit 80 so that the ON display levels (an upper limit level) of the voltage (absolute value) applied to the liquid crystal layer thereof become at a desired voltage level VRon.

In response to voltages determined based on the signals (d), (e), the transistor Q1 of the circuit 78 and the transistor Q4 of the circuit 80 operate to define the level of a non-inverted signal (a) and an inverted output signal (b), so that the OFF display level of the voltage (absolute value) applied to the liquid crystal layer remains at a predetermined level greater than 0V. As a result, the liquid crystal layer having an initial tilt angle of approx. 0° can be turned on at a high speed. Note that although the transistors Q1 and Q4 of the first and second limit circuit 78, 80 are not indispensable in this embodiment, they can be provided in the above to control the upper and lower levels of inverted and non-inverted signals so as to remain within a predetermined range for controlling the black display level and for preventing an excessive voltage from being applied to the multiplexer 82, and for enhancing synchronicity between the upper and lower levels of an AC driving signal (c).

Next, the structure of limit level generation circuit 84 will be described with reference to FIG. 6. In response to an inversion control signal which inverts the level thereof for every cycle (T) of being supplied to terminal 100, the limit level generation circuit 84 outputs a first level control signal (d) which varies the level thereof from the emitter of a transistor Q11, and a second level control signal (e) which similarly varies the level thereof from the emitter of a transmitter Q10.

When the voltage of an inversion control signal supplied to terminal 100 is H level higher than the voltage Vref of the reference power source 86, the transistor Q19 is turned on, and a current I which is substantially equal to current $I_2$ supplied from a constant current source 92 is caused to flow over resistor R1 by the first current mirror circuit CC1. At the same time, the inversion control signal supplied to terminal 200 is L level, so that a reference power source 90-2 (Vref2) is selected and connected to the resistor $R_1$. As a result, the base potential of the transistor Q10 is equal to a value "Vref2+$R_1 \cdot I_2$", and the transistor Q10 outputs a corresponding second level signal (e) from its emitter. Also, since the transistor Q14 is then is an OFF state, no current flows in the second current mirror circuit CC2. Therefore, the base potential of the transistor Q11 remains equal to the voltage "Vref2" of the reference power source 90-2, and the transmitter Q1 outputs a first level control signal (d) from its emitter.

On the other hand, when the voltage of an inversion control signal supplied to terminal 100 is a level lower than the voltage Vref' of reference power source 86, transistor Q14, which makes a differential pair with PNP transistor Q13, is turned on. A current I which is substantially equal to the current $I_1$ supplied from current source 88 is then caused to flow through resistor R2 by a second current mirror circuit CC2. As the same time, the inversion control signal supplied to terminal 200 is H level, so that a reference power source 90-1 (Vref1) 23 is selected and connected to the resistor R2. As a result, the base potential of the transistor Q11, which is connected to resistor R2, is equal to a value "Vref1–$R_1 \cdot I_1$" (FIG. 7(d)) due to the voltage drop at the resistor R2, and the transistor Q11 outputs a corresponding first level signal (d) from its emitter. Also, since transistor Q19, which makes a differential pair together with an NPN transistor Q20, is then in an OFF state, no current flows in the first current mirror circuit CC1. Therefore, the base potential of transistor Q10, which is connected between an output transistor of the first current mirror circuit CC1 and the resistor R1, remains equal to the voltage "Vref1" of the reference power source 90-1, which is connected to the other end of the resistor R1. As a result, the transistor Q10 outputs a second level control signal (e) shown in FIG. 7(e) from the emitter thereof.

Waveforms of the first and second level control signals (d) and (e) are shown with double dots chain line in (d) and (e) of FIG. 7. Waveforms shown with solid line in (d) and (e) of FIG. 7 are base voltage waveforms and coincide limit levels for the non-inverted and inverted signals (a), (b).

Having received inverted and non-inverted signals from second limit circuit 80, the multiplexer 82 alternatively selects the signals. When the inversion control signal is L level and the multiplexer 82 selects a non-inverted output signal (a) (a period T1 in FIG. 7), since the limit level at transistor Q3 is set at the value "Vref2+$R_1 \cdot I_2$", the upper level (corresponding to the ON display level at the period $T_1$) of a non-inverted output signal (a) is resultantly controlled so as not to exceed "Vref2+$R_1 \cdot I_2$". Moreover, since the limit level of the transistor Q1 is set at the value "Vref2", the lower level (corresponding to the OFF display level at the period $T_1$) of a non-inverted output signal (a) is resultantly controlled so as not to be below "Vref2". In addition, since transistor Q2 of the first limit circuit 80 controls an inverted output signal (b), which is then not selected by multiplexer 82, so as to remain "Vref2", generation of excessive voltages at a part between the switching terminals of the multiplexer 82 can be prevented.

On the other hand, when multiplexer 82 selects an inverted output signal (b) (a period T2 in FIG. 7), since the limit level at transistor Q2 of the first limit circuit 78 is set at the value "Vref1—$R_2 \cdot I_1$", the lower level (corresponding to the ON display level at the period T2 of an inverted output signal (b) is resultantly controlled so as not to be lower than "Vref1—$R_2 \cdot I_1$". Moreover since the limit level at the transistor Q4 of the second limit circuit 80 is set at the value "Vref1", the upper level (corresponding to the OFF display level at the period T2) of an inverted output signal (b) is controlled so as not to exceed "Vref1". In addition, since transistor Q3 of the second limit circuit 80 controls a non-inverted output signal (a), which is then not selected by multiplexer 82, so as to remain "Vref1", generation of excessive voltages at a part between the switching terminals of multiplexer 82 can be prevented.

Since the circuits operate as described above, the signal supplied to LCD panel 50 from the multiplexer 82 via a buffer is controlled, so that the ON display levels at periods T1 and T2 are respectively controlled to be equal to or less than "Vref2+$R_1 \cdot I_2$", or to be equal to or greater than "Vref1–$R_2 \cdot I_1$".

In this embodiment, the above processing is carried out on each of the R, G, B video signals. In this processing, the respective ON display levels VRon, VGon, VBon which are actually supplied the liquid crystal layer can be set at a desired value by setting the resistance values of the resistors R1, R2 and the voltage Vref1, Vref2 of the reference power sources 90-1, 90-2 of the limit level generation circuit 84 shown in FIG. 6 at a desired value. Specifically, when an LCD has the characteristics shown in FIG. 4, the resistance values of the resistors R1, R2 and the voltages Vref1, Vref2 of the reference power sources 90-1, 90-2 are adjusted for each color so that VRon, VGon, and VBon become 7.8V, 7V, and 4.9 V, respectively. Also, when the optical characteristics changing voltage Vth for liquid crystal varies according to a temperature change, the voltages Vref1, Vref2 of the reference power sources 90-1, 90-2 may be changed respectively for R, G, B so that Von, Voff (an OFF display level) follow the change of Vth. With this arrangement, preferable color display can be always achieved despite a change in the ambient temperature of an LCD.

It should be noted that when the ON display voltages for R, G, B can be set such that the maximum difference ΔV among the three set voltages, namely VRon, VGon, and VBon, stays within a relatively small range, e.g., within 20%, a driving voltage can be easily adjusted respectively for R, G, B while minimizing the load imposed on the driving circuit. For example, when displaying R, G, B colors in one LCD panel, the driving circuit of the LCD panel often makes RGB liquid crystal driving signals by using the same power source. Therefore, with ΔV of approx. 20%, there is no need to use separate power sources for the respective colors.

[Application to Projector]

Figure 8:
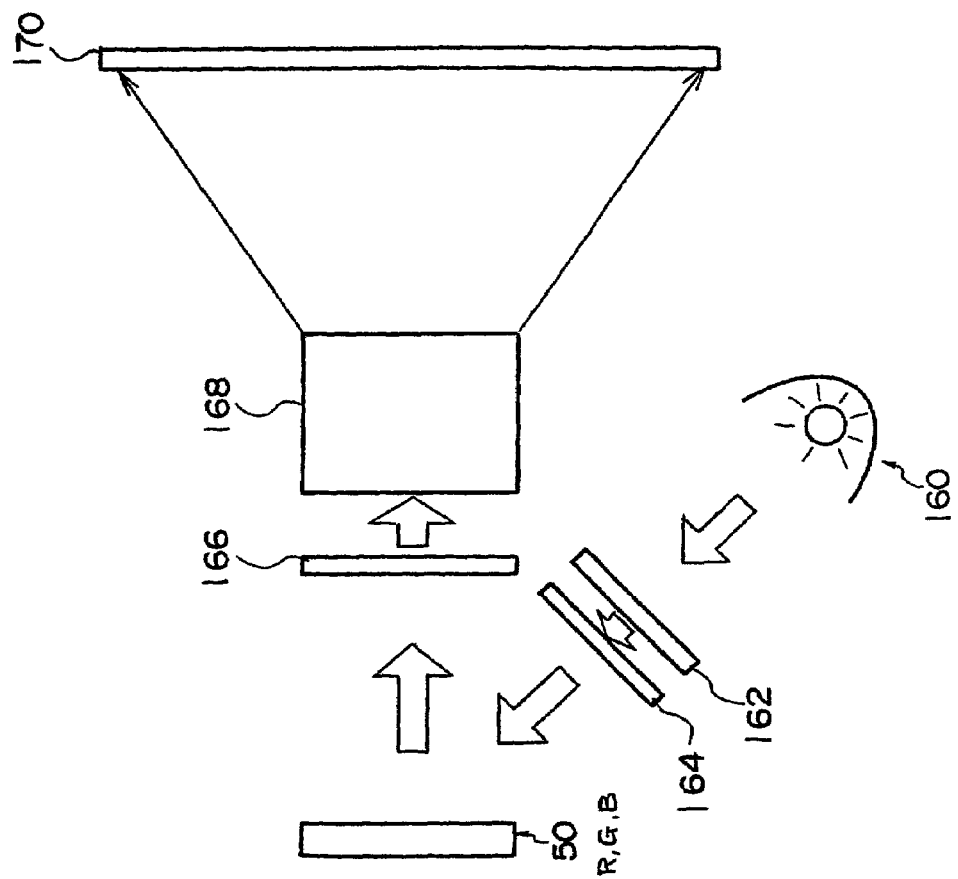
FIG. 8 is a diagram showing a structure of a projector.

In this embodiment, the above structured LCD panel 50 may be applied as a reflection type LCD to a light valve of a projector. FIG. 8 shows a structure with this application. In this case, polarization films 44, 46 shown in FIG. 2 are unnecessary for the LCD panel 50.

Light from a light source 160 is introduced into a polarized light separation filter 162, where polarized light rays in a predetermined direction are separated. The separated light rays are then introduced into a first polarization film 164 so that a predetermined linearly polarized light only passes through the first polarization film 164 to be further introduced into a reflection type LCD panel 50.

A projector may often be provided with three LCD panels 50 for R, G, B arranged in parallel for each receiving corresponding R, G, B light ray separated from the light of the light source. In this embodiment, ON display voltage levels VRon, VGon, VBon for liquid crystal driving signals are determined for every LCD panel 50 according to corresponding R, G, B light. In addition, gamma correction may be applied, if necessary, to the liquid crystal driving signals according to the respective characteristics. In the above arrangement, in which separate LCD panels 50 are used for R, G, B, the value Δn·d of each panel may be adjustable in consideration of the characteristics for R, G, B, so that wavelength dependency of voltage-transmittance characteristics of the liquid crystal layer can be more reliably canceled.

After being adjusted in a circuit shown in FIG. 5, the liquid crystal driving signals are supplied to a reflection type LCD panel 50. The LCD panel 50 then controls birefringence of the liquid crystal layer for every liquid crystal pixel, and the panel 50 reflects the linearly polarized light from the first polarization plate 164 and thereby the reflected light ejects to the second polarization film 166. The R, G, B lights ejected from the panel 50 and then passed through a second polarization film 166 are then composited by a compositing optical system (not shown) into a color image for projection, after being enlarged, onto a screen 170 by a projector lens 168.

What is claimed is:

1. A liquid crystal display having liquid crystal sandwiched between a pair of substrates having electrodes for driving the liquid crystal based on respective R, G, and B signals to control transmittance of each of the R, G, and B light components for color display, wherein
    each of upper limit values of ranges for driving voltages respectively for R display, G display, and B display applied to the liquid crystal is set independently for R light, G light, and B light, without a control voltage applied to the substrates to control the intensity of R, G, and B light simultaneously,
    an upper limit value for a range of values usable within an entire duration of display as driving voltages for respective R, G, and B light components is set independently for each of R, G, and B light components,
    among said independently set upper limit values for respective R, G, and B light components, an upper limit value for at least one of the colors differs from the upper limit values for the other colors,
    a display portion having a plurality of pixels in a matrix form, and
    a driver circuit for said display portion which supplies a driving voltage signal corresponding to display content to a corresponding one of said pixels in said display portion, wherein
    said electrode for driving said liquid crystal provided on a first substrate among said pair of substrates is a pixel electrode of a matrix form which is individually formed for each of said pixels and is connected to a thin film transistor, and
    said driver circuit for the said display portion comprises a maximum transmittance voltage limiter which limits an absolute value of a maximum transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

2. A liquid crystal display of claim 1, wherein each of said upper limit values of ranges for the driving voltages applied to the liquid crystal is set based on the transmittance characteristic of each of R, G, and B light components.

3. A liquid crystal display according to claim 1, wherein a liquid crystal control driving signal for R light, a liquid crystal control driving signal for G light, and a liquid crystal control driving signal for B light are separately subjected to gamma correction based on transmittance characteristics of the R, G, and B light components.

4. A liquid crystal display according to claim 1, wherein the pair of substrates includes a first substrate,
    electrodes for driving the liquid crystal formed on the first substrate include a plurality of pixel electrodes arranged in matrix thereon; and
    the plurality of pixel electrodes are connected to corresponding poly-Si thin film transistors each using a poly-Si layer formed at a low temperature for an active layer.

5. A liquid crystal display according to claim 1, wherein among said independently set upper limit values for respective R, G, and B light components, at least the upper limit values for R and B light components differ from one another.

6. An electrically controlled birefringence type liquid crystal display having liquid crystal sandwiched between a pair of substrates having electrodes for driving the liquid crystal based on a liquid crystal control driving signal for R light, a liquid crystal control driving signal for G light, and a liquid crystal control driving signal for B light to control transmittance of each of the R, G, and B light components for color display, wherein
    each of upper limit values of ranges for driving voltages respectively for R display, G display, and B display applied to the liquid crystal is set independently for R light, G light, and B light, without a control voltage applied to the substrates to control the intensity of R, G, and B light simultaneously,
    an upper limit value for a range of values usable within an entire duration of the display as driving voltages for respective R, G, and B light components is set independently for each of R, G, and B light components,
    among said independently set upper limit values for respective R, G, and B light components, an upper limit value for at least one of the colors differs from the upper limit values for the other colors,
    a display portion having a plurality of pixels in a matrix form, and
    a driver circuit for said display portion which supplies a driving voltage signal corresponding to display content to a corresponding one of said pixels in said display portion, wherein
    said electrode for driving said liquid crystal provider on a first substrate among said pair of substrates is a pixel electrode of a matrix form which is individually formed for each of said pixels and is connected to a thin film transistor, and
    said driver circuit for the said display portion comprises a maximum transmittance voltage limiter which limits an absolute value of a maximum transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

7. A liquid crystal display according to claim 6, wherein the liquid crystal control driving signal for R light, the liquid crystal control driving signal for G light, and the liquid crystal control driving signal for B light are separately subjected to gamma correction based on transmittance characteristics of the R, G, and B light components.

8. A liquid crystal display according to claim 5, wherein
the pair of substrates includes a first substrate,
electrodes for driving the liquid crystal formed on the first substrate include a plurality of pixel electrodes arranged in matrix thereon; and
the plurality of pixel electrodes are connected to corresponding poly-Si thin film transistors each using a poly-Si layer formed at a low temperature for an active layer.

9. A liquid crystal display according to claim 6, wherein among said independently set upper limit values for respective R, G, and B light components, at least the upper limit values for R and B light components differ from one another.

10. A liquid crystal display having liquid crystal sandwiched between a pair of substrates having electrodes for driving the liquid crystal based on respective R, G, and B signals to control transmittance of each of the R, G, and B light components for color display, wherein
each of upper limit values of ranges for driving voltages for application to the liquid crystal is set independently for each of R, G, and B light, without a control voltage applied to the substrates to control the intensity of R, G, and B light simultaneously,
the maximum difference among the set voltages stays within 20%,
an upper limit value for a range of values usable within an entire duration of the display as driving voltages for respective R, G, and B light components is set independently for each of R, G, and B light components,
among said independently set upper limit values for respective R, G, and B light components, an upper limit value for at least one of the colors differs from the upper limit values for the other colors,
a display portion having a plurality of pixels in a matrix form, and
a driver circuit for said display portion which supplies a driving voltage signal corresponding to display content to a corresponding one of said pixels in said display portion, wherein
said electrode for driving said liquid crystal provider on a first substrate among said pair of substrates is a pixel electrode of a matrix form which is individually formed for each of said pixels and is connected to a thin film transistor, and
said driver circuit for the said display portion comprises a maximum transmittance voltage limiter which limits an absolute value of a maximum transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

11. A liquid crystal display according to claim 10, wherein among said independently set upper limit values for respective R, G, and B light components, at least the upper limit values for R and B light components differ from one another.

12. A liquid crystal display having liquid crystal sandwiched between a pair of substrates having electrodes for driving the liquid crystal, and which shows non-transmittance to the light when no voltage is applied, for applying driving voltages to the liquid crystal based on each of R, G, and B signals to control transmittance of each of the R, G, and B light components for color display, wherein
each of upper limit values for defining the maximum light transmittance of the liquid crystal, of ranges of driving voltages applied to said liquid crystal, is set independently for each of R, G, and B light, without a control voltage applied to the substrates to control the intensity of R, G, and B light simultaneously,
an upper limit value for a range of values usable within an entire duration of the display as driving voltages for respective R, G, and B light components is set independently for each of R, G, and B light components,
among said independently set upper limit values for respective R, G, and B light components, an upper limit value for at least one of the colors differs from the upper limit values for the other colors,
a display portion having a plurality of pixels in a matrix form, and
a driver circuit for said display portion which supplies a driving voltage signal corresponding to display content to a corresponding one of said pixels in said display portion, wherein
said electrode for driving said liquid crystal provider on a first substrate among said pair of substrates is a pixel electrode of a matrix form which is individually formed for each of said pixels and is connected to a thin film transistor, and
said driver circuit for the said display portion comprises a maximum transmittance voltage limiter which limits an absolute value of a maximum transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

13. The liquid crystal display of claim 12, wherein
the maximum difference among said set upper limits of ranges of driving voltages applied to the liquid crystal for each of R, G, and B light never exceeds 20%.

14. A liquid crystal display according to claim 12, wherein among said independently set upper limit values for respective R, G, and B light components, at least the upper limit values for R and B light components differ from one another.

15. A liquid crystal display, wherein
liquid crystal is sandwiched between a pair of substrates,
individual pixel electrodes are formed for each pixel on one of said substrates,
R, G, and B driving signals corresponding to each of said pixel electrodes are applied for driving the liquid crystal by the potential difference between said pixel electrodes and opposing electrodes formed on the other substrate, to control the transmittance of each of the R, G, and B light components for color display, and
each of upper limit values of ranges for driving voltages respectively for said R, G, and B driving signals applied to said pixel electrodes is set independently for R, G, and B light, without a control voltage applied to the substrates to control the intensity of R, G, and B light simultaneously,
an upper limit value for a range of values usable within an entire duration of the display as driving voltages for respective R, G, and B light components is set independently for each of R, G, and B light components,
among said independently set upper limit values for respective R, G, and B light components, an upper limit value for at least one of the colors differs from the upper limit values for the other colors,
a display portion having a plurality of pixels in a matrix form, and a driver circuit for said display portion which supplies a driving voltage signal corresponding to display content to a corresponding one of said pixels in said display portion, wherein said electrode for driving said liquid crystal provider on a first substrate among said pair of substrates is a pixel electrode of a matrix form which is individually formed for each of said pixels and is connected to a thin film transistor, and said driver circuit for the said display portion comprises a maximum transmittance voltage limiter which limits an absolute value of a maximum transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

16. The liquid crystal display of claim 15, wherein the maximum difference among said set upper limits of ranges of driving voltages for each of R, G, and B light never exceeds 20%.

17. The liquid crystal display of claim 15, wherein the maximum light transmittance is defined by said upper limit values of ranges of said driving voltages.

18. A liquid crystal display according to claim 15, wherein among said independently set upper limit values for respective R, G, and B light components, at least the upper limit values for R and B light components differ from one another.

19. A reflective type liquid crystal display having liquid crystal sandwiched between a pair of substrates, a reflection electrode formed on one of said pair of substrates, for driving the liquid crystal by the potential difference between said reflection electrode and a transparent electrode formed on the other substrate, to reflect the incident light from said transparent electrode side at said reflective electrode and to control the amount of light of each of the R, G, and B light components re-emitted from said transparent electrode for color display, wherein each of upper limit values of ranges for driving voltages for R display, G display, and B display applied to said liquid crystal by said transparent electrode and said reflection electrode is set independently for R, G, and B light, without a control voltage applied to the substrates to control the intensity of R, G, and B light simultaneously, an upper limit value for a range of values usable within an entire duration of the display as driving voltages for respective R, G, and B light components is set independently for each of R, G, and B light components, among said independently set upper limit values for respective R, G, and B light components, an upper limit value for at least one of the colors differs from the upper limit values for the other colors, a display portion having a plurality of pixels in a matrix form, and a driver circuit for said display portion which supplies a driving voltage signal corresponding to display content to a corresponding one of said pixels in said display portion, wherein individual pixel electrodes are formed for each of said plurality of pixels on one of said pair of substrates;

R, G, and B driving signals corresponding to each of said pixel electrodes are applied for driving the liquid crystal by the potential difference between said pixel electrodes and an opposing common electrode formed on the other substrate, to control the transmittance of each of the R, G, and B light components for colored display;

each of upper limit values of ranges for driving voltages respectively for said R, G, and B driving signals applied to said pixel electrodes is set independently for R, G, and B, light, an upper limit value for a range of values usable within an entire duration of the display as driving voltages for respective R, G, and B light components is set independently for each of R, G, and B light components, among said independently set upper limit values for respective R, G, and B light components, an upper limit value for at least one of the colors differs from the upper limit values for the other colors, a display portion having a plurality of pixels in a matrix form, and a driver circuit for said display portion which supplies a driving voltage signal corresponding to display content to a corresponding one of said pixels in said display portion, wherein said electrode for driving said liquid crystal provider on a first substrate among said pair of substrates is a pixel electrode of a matrix form which is individually formed for each of said pixels and is connected to a thin film transistor, and said driver circuit for the said display portion comprises a maximum transmittance voltage limiter which limits an absolute value of a maximum said electrode for driving said liquid crystal provider on a first substrate among said pair of substrates is a pixel electrode of a matrix form which is individually formed for each of said pixels and is connected to a thin film transistor, and said driver circuit for the said display portion comprises a maximum transmittance voltage limiter which limits an absolute value of a maximum transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

20. The reflective type liquid crystal display of claim 19, wherein said reflection electrode is a pixel electrode formed individually for each pixel, and each of the upper limit values of ranges for driving voltages of said R, G, and B driving signals applied to respective pixel electrode is set independently for R, G, and B light.

21. A liquid crystal display according to claim 19, wherein among said independently set upper limit values for respective R, G, and B light components, at least the upper limit values for R and B light components differ from one another.

22. A liquid crystal display having a liquid crystal display panel configured by sandwiching liquid crystal between a pair of substrates, wherein:

a plurality of pixels are provided within said liquid crystal display panel, each of said plurality of pixels being separately assigned to one of R, G, and B colors; transmittance of liquid crystal of said driving voltage signal which exists for each of R, G, and B to a voltage determined according to a transmittance characteristic of each of R, G, and B, and said driving voltage signal in which the maximum transmittance voltage level is limited is supplied to a corresponding one of said pixels of said display portion through said thin film transistor.

23. A liquid crystal display according to claim 22, wherein among said independently set upper limit values for respective R, G, and B light components, at least the upper limit values for R and B light components differ from one another.

24. A liquid crystal display, comprising;
a display section and a display section driving circuit which supplies a driving voltage signal in accordance with a display content, wherein
said display section driving circuit includes a maximum transmittance voltage limiting circuit which limits throughout an entire duration of display, regardless of display content, a maximum transmittance voltage level existing for each of R, G, and B light components that achieves maximum liquid crystal transmittance of said driving voltage signals to a voltage level determined in accordance with a transmittance characteristic of each of R, G, and B light components, and
said driving voltage signal having its maximum transmittance voltage level limited by said voltage limiting circuit is supplied to a corresponding pixel in said display section.

25. A liquid crystal display as defined in claim 24, wherein said display section driving circuit includes a minimum transmittance voltage limiting circuit which limits, regardless of display content, a minimum transmittance voltage level for achieving minimum liquid crystal transmittance of said driving voltage signal to a predetermined voltage level greater than 0V by absolute value.

26. A liquid crystal display as defined in claim 24, wherein among said driving voltage signals for respective R, G, and B light components, at least said maximum transmittance voltage levels determined and limited for R and B light components differ from one another.

27. A liquid crystal display as defined in claim 24, wherein the liquid crystal is of a normally black type which shows a non-transmittance characteristic in a state of no voltage application.

28. A liquid crystal display as defined in claim 27, wherein among said driving voltage signals for respective R, G, and B light components, said maximum transmittance voltage level for B light is limited to a voltage level smaller than said maximum transmittance voltage level for R light by absolute value.

29. A voltage-driven birefringence type liquid crystal display having liquid crystal sandwiched between a pair of substrates having electrodes for driving the liquid crystal based on respective R, G, and B signals to control transmittance of each of the R, G, and B light components for color display, the liquid crystal display comprising:
a display portion having a plurality of pixels in a matrix form, and
a driver circuit for said display portion which supplies a driving voltage signal corresponding to display content to a corresponding one of said pixels in said display portion, wherein
said electrode for driving said liquid crystal provided on a first substrate among said pair of substrates is a pixel electrode of a matrix form which is individually formed for each of said pixels,
a thin film transistor is connected to a corresponding one of said pixel electrodes,
said driver circuit for said display portion comprises a maximum transmittance voltage limiter which limits maximum absolute values of levels of non-inverted driving voltage signal and inverted driving voltage signal for determining a maximum transmittance voltage level for achieving a maximum transmittance of liquid crystal of said driving voltage signal which exists for each of R, G, and B to a voltage determined according to a transmittance characteristic of each of R, G, and B, and
said non-inverted driving voltage signal and said inverted driving voltage signal in which said maximum transmittance voltage levels are limited are periodically switched in a predetermined period and supplied to said pixel through said thin film transistor.

30. A liquid crystal display according to claim 29, wherein said driver circuit for said display portion further comprises a minimum transmittance voltage limiter which limits a minimum transmittance voltage level for achieving a minimum transmittance of liquid crystal of said driving voltage signal to a predetermined level having an absolute value of greater than 0V, and
said driving voltage signal in which the voltage level is limited by said maximum transmittance voltage limiter and said minimum transmittance voltage.

31. A liquid crystal display according to claim 29, wherein said liquid crystal is of a normally black type in which said liquid crystal is non-transmitting in a state of application of no voltage, and
a rubbingless type vertical orientation film for aligning a major axis direction of molecules of said liquid crystal along a thickness direction of a liquid crystal layer in said state of application of no voltage is provided on a surface of each of said pair of substrates, said surface being a contact surface with the liquid crystal.

32. A liquid crystal display according to claim 29, wherein said thin film transistor is a polycrystalline silicon thin film transistor in which polycrystalline silicon is used in an active layer.

* * * * *